United States Patent
Xu et al.

(10) Patent No.: US 11,901,014 B2
(45) Date of Patent: Feb. 13, 2024

(54) PARTIAL BLOCK HANDLING IN A NON-VOLATILE MEMORY DEVICE

(71) Applicant: Micron Technology, Inc., Boise, ID (US)

(72) Inventors: Zhongguang Xu, San Jose, CA (US); Nicola Ciocchini, Boise, ID (US); Zhenlei Shen, Milpitas, CA (US); Charles See Yeung Kwong, Redwood City, CA (US); Murong Lang, San Jose, CA (US); Ugo Russo, Boise, ID (US); Niccolo' Righetti, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 88 days.

(21) Appl. No.: 17/739,741

(22) Filed: May 9, 2022

(65) Prior Publication Data

US 2023/0360704 A1  Nov. 9, 2023

(51) Int. Cl.
*G11C 16/10* (2006.01)
*G11C 16/34* (2006.01)
*G11C 16/26* (2006.01)
*G11C 16/08* (2006.01)

(52) U.S. Cl.
CPC .......... *G11C 16/102* (2013.01); *G11C 16/08* (2013.01); *G11C 16/26* (2013.01); *G11C 16/3481* (2013.01)

(58) Field of Classification Search
CPC ............................. G11C 16/102; G11C 16/10
USPC ..................................... 365/189.011
See application file for complete search history.

(56) References Cited

U.S. PATENT DOCUMENTS

| | | | | |
|---|---|---|---|---|
| 2011/0099350 A1* | 4/2011 | Feldman | ............... | G06F 3/0619 711/E12.078 |
| 2013/0250677 A1* | 9/2013 | Nam | ....................... | G11C 16/10 365/185.03 |
| 2015/0332770 A1* | 11/2015 | Kim | ....................... | G11C 16/20 365/185.12 |

* cited by examiner

*Primary Examiner* — Muna A Techane
(74) *Attorney, Agent, or Firm* — Lowenstein Sandler LLP (57) ABSTRACT

A processing device in a memory sub-system initiates a partial block handling protocol for a closed block of a memory device, the block comprising a plurality of wordlines. The processing device further sends a first programming command to the memory device to program one or more wordlines of the block with first padding data having a first data pattern, wherein the one or more wordlines are adjacent to a last wordline of the block programmed before the block was closed. In addition, the processing device sends a second programming command to the memory device to program all of a set of remaining wordlines of the block with second padding data having a second data pattern comprising fewer bits of data per cell than the first data pattern.

20 Claims, 6 Drawing Sheets

PARTIAL BLOCK HANDLING IN A NON-VOLATILE MEMORY DEVICE

TECHNICAL FIELD

Embodiments of the disclosure relate generally to memory sub-systems, and more specifically, relate to partial block handling in a non-volatile memory device of a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to partial block handling in a non-volatile memory device of a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

One example of a memory sub-system is a solid-state drive (SSD) that includes one or more non-volatile memory devices and a memory sub-system controller to manage the non-volatile memory devices. A given segment of one of those memory devices (e.g., a block) can be characterized based on the programming state of the memory cells associated with wordlines contained within the segment. For example, an open block can refer to a block in which some of the wordlines have associated memory cells which have been programed, but other wordlines have associated memory cells which are not currently programmed (e.g., are in an erase state). A closed block can refer to a block in which all of the wordlines have associated memory cells which have been programmed. A block can also be characterized based on age, which can be defined in view of a number of program/erase (P/E) cycles that have been performed with respect to the block. For example, a cycled block can refer to a block that has undergone a number of P/E cycles that exceeds a first threshold number of P/E cycles (e.g., an older block), and a fresh block can refer to a block that has undergone a number of P/E cycles less than a second threshold number of P/E cycles (e.g., a newer block).

One phenomenon observed in memory devices is $V_T$ distribution shift, also referred to herein as temporal voltage shift (TVS). There are a number of different causes of TVS, including cell-to-cell (C2C) coupling which impacts the observable level of charge in neighboring memory cells, the back pattern effect which includes an overall $V_T$ shift due to increase array loading resistance especially prominent in earlier programmed cells, and slow charge loss (SCL) which causes vertical charge loss and lateral charge migration. For example, with respect to programmed pages of a block, SCL can cause $V_T$ distributions of the programmed pages to shift towards lower voltages as charge diminishes over time and/or with respect to changes in temperature. That is, SCL and the corresponding $V_T$ distribution shift towards lower voltages can be proportional to amount of time elapsed data was programmed. Conversely, with respect to erased pages (e.g., erased pages of partially programmed blocks), storage charge gain (SCG) can cause $V_T$ distributions of the erased pages to shift towards higher voltages.

As used herein, a memory unit can refer to a plane, a block, a page, a cell, a zone, or any other of segment or unit of memory. A memory unit can be closed when the memory unit is completely written and can be referred to as a "full memory unit," a "full block," or a "closed block." For example, in a closed block all the pages including the last page have been written. A memory unit remains open when the memory unit is partially written. In certain memory sub-systems, however, the memory sub-system controller implements a block usage policy that closes a block or other memory unit after a certain period of time (e.g., four hours) has passed since the block or other memory unit was first written. For example, the memory sub-system controller can maintain a timer or counter that is started when the first page of a block is written and expires after the period of time is reached. At that time, the block is logically closed, such that the additional pages of the block cannot be written, even if the block remains physically open (i.e., has additional capacity in unwritten pages). The block usage policy prevents large variations in rates of charge loss among the programmed memory cells associated with different wordlines (e.g., cells associated with earlier programmed wordlines can exhibit greater charge loss than cells associated with more recently programmed wordlines) by limiting the time between when different cells of the same memory unit are programmed. Such a memory unit remains partially written (also referred to as "partial memory unit" or a "partial block" herein) because it has not been completely written. For example, a memory unit, such as a block, can be partially written when after writing to the block one or more pages of the block remain unwritten.

Partially written memory units can exhibit more errors over time than completely written memory units due to the TVS effects described above, which can be more pronounced in a partial memory unit. That is, the voltage difference between a wordline of a memory unit that has been written and a wordline of the same memory unit that has not been written can cause changes in threshold voltages of the written memory cells, which can produce bit errors. Further, the C2C coupling effect can produce a greater number of errors the longer a memory unit remains partially written. Moreover, partially written memory units configured to store multiple bits per memory cell can be more susceptible to the C2C coupling effect (e.g., more errors) than memory units configured to store a single bit per memory cell due to the reduced margin between threshold voltages in memory cells that store multiple bits. In addition, partial blocks have at least one wordline with memory cells that were the last to be programmed. Such a wordline, referred to herein as a "boundary wordline," can be adjacent to a subsequent wordline with memory cells that have not been programmed. This boundary wordline experiences even greater C2C coupling and SCL than the other programmed wordlines (i.e., "inner wordlines") in the partial block. As a result, techniques used to account for TVS effects on full blocks, may not be effective when used on partial blocks.

Certain memory sub-systems attempt to eliminate or reduce TVS effects in partial blocks through various padding schemes, where one or more wordlines, in addition to those programmed with host data before the block was logically closed, are written with extra (e.g., "dummy") data. Some systems pad one additional wordline (e.g., the wordline adjacent to the boundary wordline) with dummy data where the memory cells associated with the additional wordline are configured as triple level cell (TLC) memory. Such an approach simply converts the previous boundary wordline into an inner wordline, which is still susceptible to TVS effects. Other systems pad all of the remaining unwritten wordlines in the partial block with dummy data where the memory cells associated with the additional wordline are configured as TLC memory. This approach essentially converts the partial block to a full block and allows the TVS effects to be addressed, however, the additional padding is time consuming which decreases the quality of service of the memory sub-system.

Aspects of the present disclosure address the above and other issues by implementing an optimal padding scheme for partial block handling in a non-volatile memory device of a memory sub-system. In one embodiment, upon issuing a first write command to a given memory unit (e.g., a block) of a memory device, a memory sub-system controller begins tracking a period of time defined by an associated block usage policy. The memory sub-system controller continues issuing additional write commands to the memory device causing memory cells associated with additional wordlines of the memory unit to be programmed. Upon expiration of the period of time, the memory sub-system controller logically closes the memory unit and stops issuing additional write commands to that memory unit. If the memory unit has not been fully programmed, the memory sub-system controller initiates a partial block handling protocol where the memory cells associated with the remaining wordlines of the memory unit (i.e., those memory cells that were not previously programmed) can be programmed with padding data having a mixed pattern. In one embodiment, the memory sub-system controller causes the memory cells associated with one or more wordlines of the memory unit (e.g., one or more wordlines adjacent to the last wordline to be programmed) to be programmed with padding data (e.g., "dummy data") in a TLC pattern (e.g., to one of eight different voltage levels representing three bits of data per cell). In such an embodiment, the memory sub-system controller further causes the memory cells associated with one or more remaining wordlines of the memory unit (e.g., the remaining wordlines not previously programmed and not programmed with TLC padding data) to be programmed with padding data in at least one of a single-level cell (SLC) pattern (e.g., to one of two different voltage levels representing one bit of data per cell) or a multi-level cell (MLC) pattern (e.g., to one of four different voltage levels representing two bits of data per cell). The one or more wordlines programmed with TLC padding data serve to reduce the TVS effects at the original boundary wordlines of the partial block, while the remaining wordlines programmed with SLC or MLC padding data convert the partial block to a full block, thereby reducing the TVS effects at the inner wordlines.

Advantages of the approaches described herein include, but are not limited to, improved performance in the memory sub-system. By padding the previously unprogrammed wordlines in the partial block, the TVS effects normally present are significantly reduced, which reduces the error rate seen when the data is later read. Furthermore, the performance rate of memory management operations can be reduced, such as unnecessary folding operations or read retry operations. In addition, since the majority of the unprogrammed wordlines are programmed in either an SLC or MLC pattern, and since the SLC and MLC programming can be performed significantly faster than the TLC programming, the total time for the partial block handling protocol is reduced and the quality of service in the memory sub-system is maintained at an adequate level.

Figure 1A:
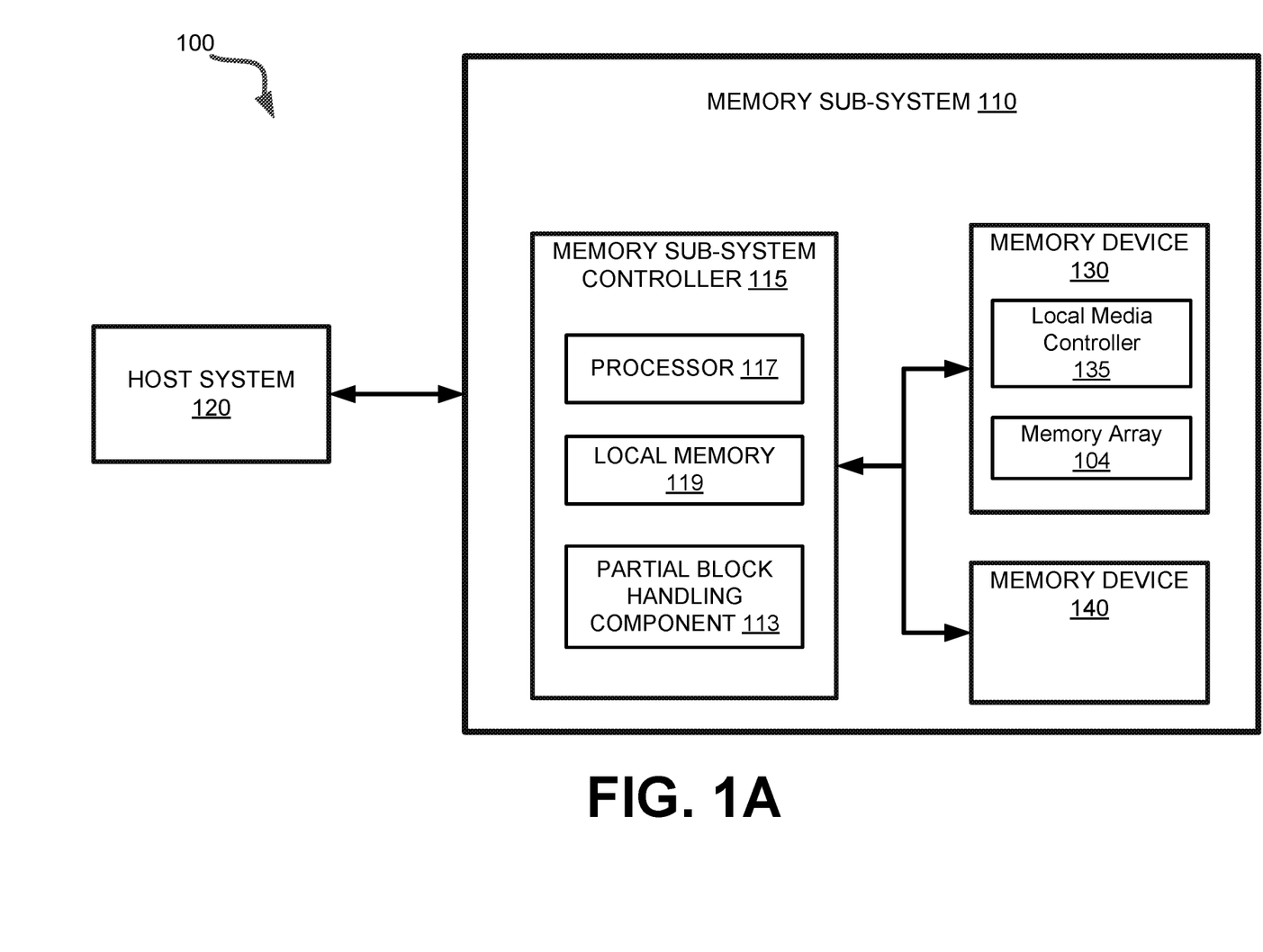
FIG. 1A illustrates an example computing system that includes a memory sub-system in accordance with some embodiments of the present disclosure.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., one or more memory device(s) 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., the one or more memory device(s) 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory device(s) 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory device(s) 130. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some embodiments, the memory device(s) 130 include local media controllers 135 that operate in conjunction with memory sub-system controller 115 to execute operations on one or more memory cells of the memory device(s) 130. An external controller (e.g., memory sub-system controller 115) can externally manage the memory device 130 (e.g., perform media management operations on the memory device(s) 130). In some embodiments, a memory device 130 is a managed memory device, which is a raw memory device (e.g., memory array 104) having control logic (e.g., local controller 135) for media management within the same memory device package. An example of a managed memory device is a managed NAND (MNAND) device. Memory device(s) 130, for example, can each represent a single die having some control logic (e.g., local media controller 135) embodied thereon. In some embodiments, one or more components of memory sub-system 110 can be omitted.

In one embodiment, the memory sub-system 110 includes a partial block handling component 113. In one embodiment, upon issuing a first write command to a given memory unit (e.g., a block) of a memory device, such as memory device 130, partial block handling component 113 begins tracking a period of time defined by an associated block usage policy. The memory sub-system controller 115 continues issuing additional write commands to the memory device 130 causing memory cells associated with additional wordlines of the memory unit to be programmed. Upon expiration of the period of time, partial block handling component 113 logically closes the memory unit to prevent additional write commands from being issued to that memory unit. If the memory unit has not been fully programmed, partial block handling component 113 initiates a partial block handling protocol where the memory cells associated with the remaining wordlines of the memory unit (i.e., those memory cells that were not previously programmed) can be programmed with padding data having a mixed pattern. In one embodiment, partial block handling component 113 causes the memory cells associated with one or more wordlines of the memory unit (e.g., one or more wordlines adjacent to the last wordline to be programmed) to be programmed with padding data (e.g., "dummy data") in a TLC pattern (e.g., to one of eight different voltage levels representing three bits of data per cell). In such an embodiment, partial block handling component 113 further causes the memory cells associated with one or more remaining wordlines of the memory unit (e.g., the remaining wordlines not previously programmed and not programmed with TLC padding data) to be programmed with padding data in at least one of a single-level cell (SLC) pattern (e.g., to one of two different voltage levels representing one bit of data per cell) or a multi-level cell (MLC) pattern (e.g., to one of four different voltage levels representing two bits of data per cell). The one or more wordlines programmed with TLC padding data serve to reduce the TVS effects at the original boundary wordlines of the partial block, while the remaining wordlines programmed with SLC or MLC padding data convert the partial block to a full block, thereby reducing the TVS effects at the inner wordlines. Further details with regards to the operations of partial block handling component 113 are described below.

Figure 1B:
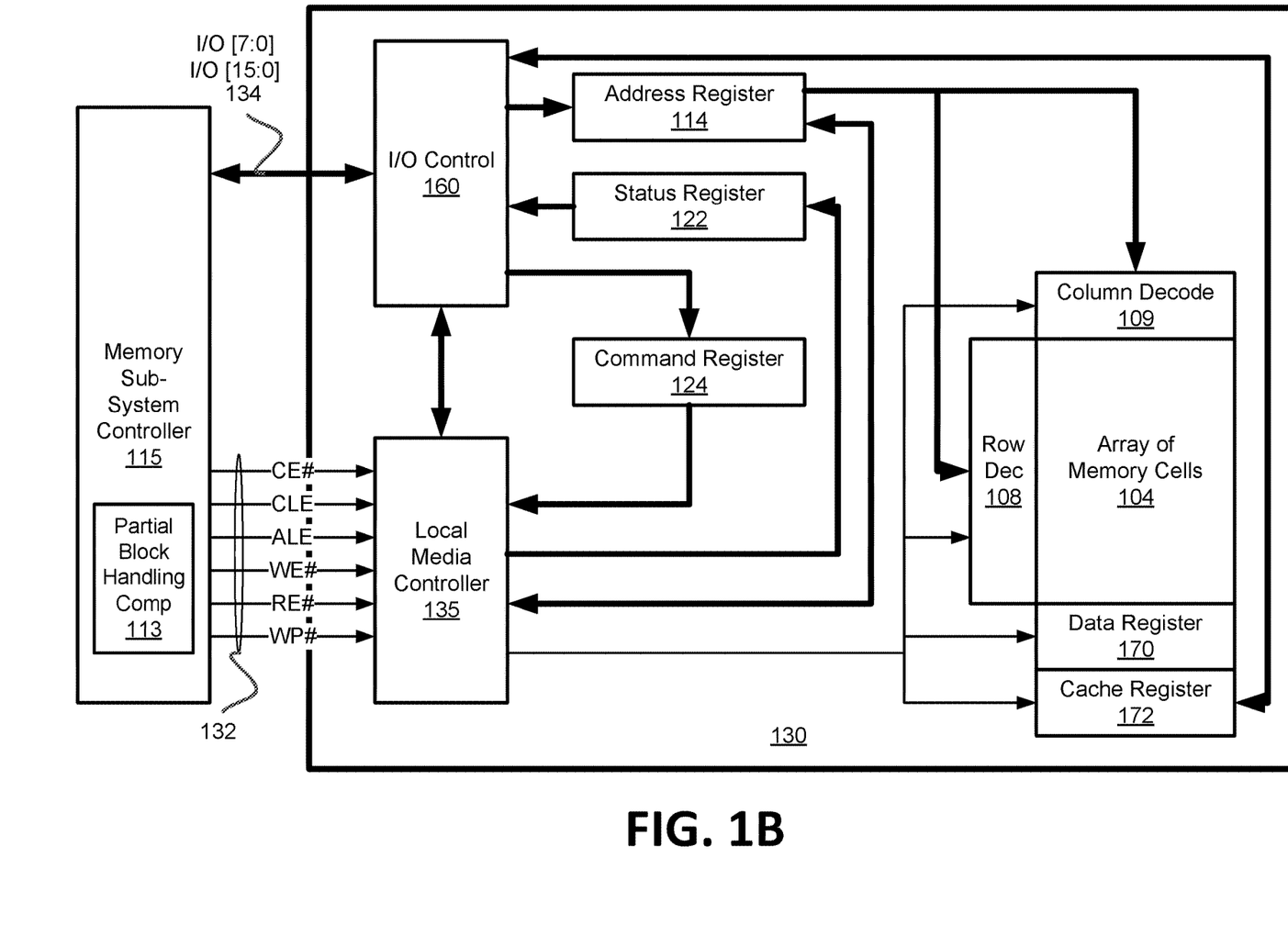
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device. In one embodiment, memory sub-system controller 115 includes partial block handling component 113 configured to perform the partial block handling operations described herein including programming portions of a memory unit with padding data having a mixed pattern.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
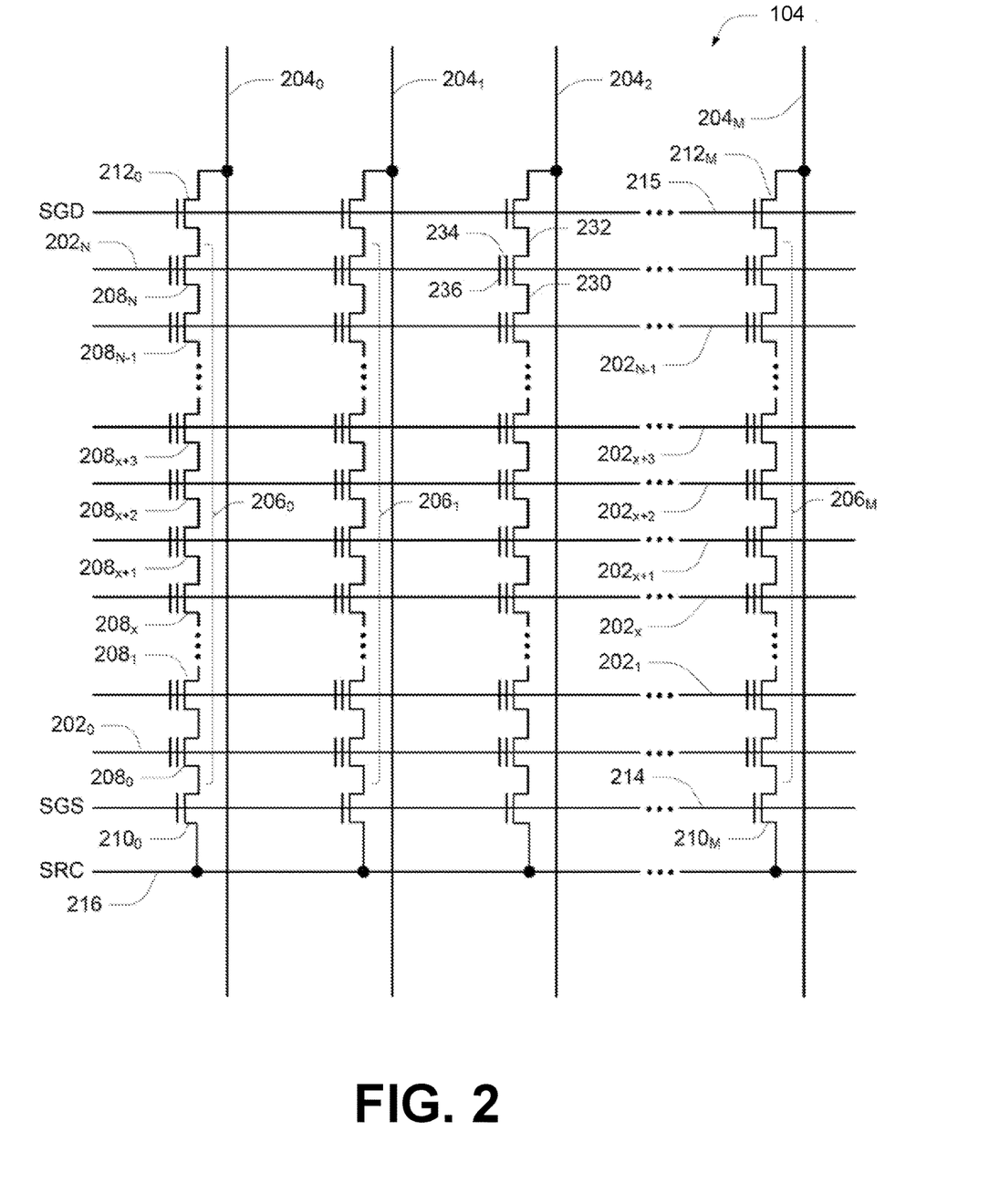
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
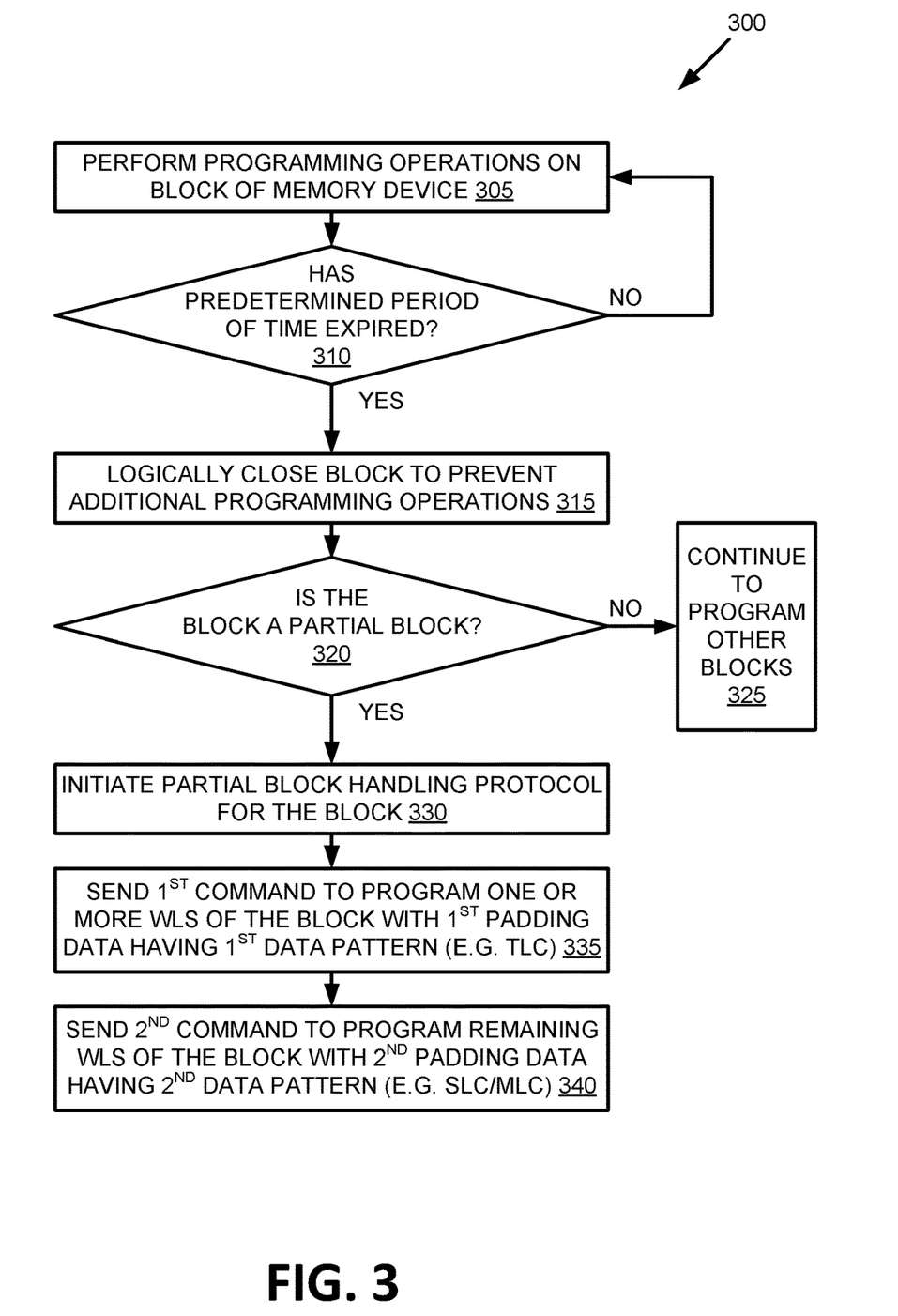
FIG. 3 is a flow diagram of an example method of partial block handling in a non-volatile memory device of a memory sub-system in accordance with some embodiments of the present disclosure.

FIG. 3 is a flow diagram of an example method of partial block handling in a non-volatile memory device of a memory sub-system in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by partial block handling component 113 of FIG. 1A. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing logic (e.g., partial block handling component 113 or other portions of memory sub-system controller 115) can perform a series of programming operations on a block or other memory unit of a memory device, such as memory device 130. For example, the processing logic can send one or more programming commands to cause the memory device to be programmed with corresponding data. As described herein, the block can include a number of wordlines, such as wordlines $202_0$-$202_N$ illustrated in FIG. 2. Another example of a block is illustrated in FIG. 4.

Figure 4:
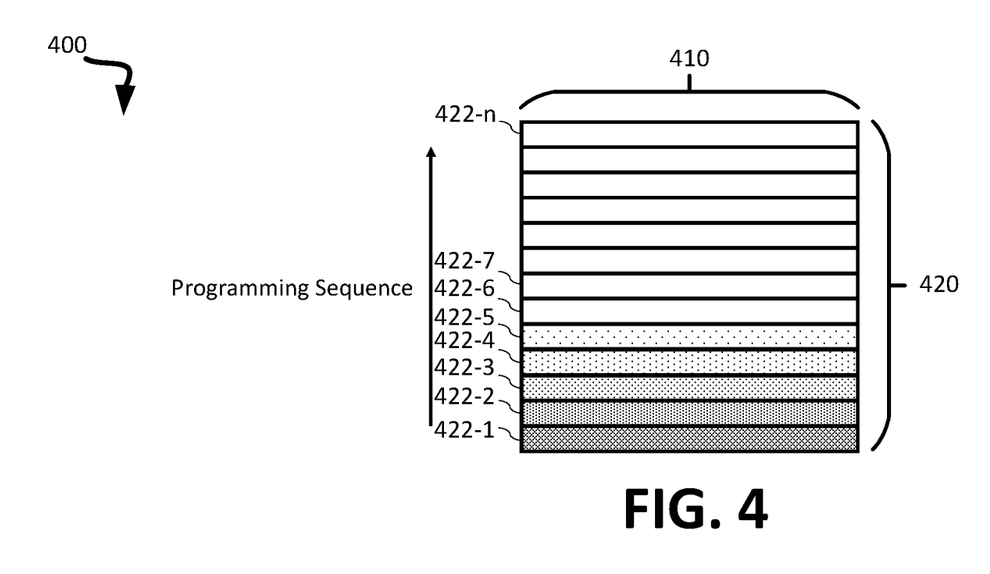
FIG. 4 is a diagram illustrating an example block of a memory device, in accordance with some embodiments of the present disclosure.

FIG. 4 is a diagram 400 illustrating an example block 410, in accordance with some embodiments of the present disclosure. For example, the block 410 can be a NAND block or can represent some other segment of memory device 130. As shown, the block 410 includes a number of individual portions (e.g., pages) 420, including pages 422-1 through 422-n. In one embodiment, the programming sequence proceeds from the bottom of block 410 to the top, as illustrated in diagram 400. Accordingly, page 422-1 can be associated with a first wordline to be programmed, while page 422-n can be associated with a last wordline to be programmed. If all of the pages 422-1 through 422-n have been programmed, block 410 can be considered to be "physically closed." If only a subset of the pages (e.g., one or more pages), such as pages 422-1 through 422-5 for example, have been programmed, block 410 can be considered to be "physically open."

Referring again to FIG. 3, at operation 310, the processing logic can determine that a predetermined period of time associated with programming the block of the memory device has expired. In one embodiment, partial block handling component 113 maintains a counter or timer to track the predetermined period of time. For example, the counter or timer could start at an initial value when page 422-1 is programmed to the memory cells of the first wordline of block 410, and can be incremented or decremented periodically until a final value is reached. In one embodiment, the predetermined period of time is defined according to a block usage policy that closes a block or other memory unit after the period of time (e.g., four hours) has passed since the block or other memory unit was first written. If the predetermined period of time has not yet expired, the processing logic can continue to perform program operations on the block. In one embodiment, a first subset of the wordlines of block 410 are programmed during the predetermined period of time (e.g., the wordlines storing pages 422-1 through 422-5).

If, however, the predetermine period of time has expired, at operation 315, the processing logic can logically closing the block 410 of the memory device 130 to prevent additional program operations from being performed on the block. In one embodiment, partial block handling component 113 adds an indication of the block to a list of logically closed blocks. Memory sub-system controller 115 can check the list before performing any additional programming operations and will not perform the program operation of the identified block is on the list.

At operation 320, the processing logic determines whether the block is a partial block. In one embodiment, block handling component 113 determines whether the block 410 comprises a subset of the wordlines that were not programmed during the predetermined period of time for which the block was open. As described above even if block 410 is physically open, it can be logically closed by the memory sub-system controller, such as if the predetermined period of time has expired since page 422-1 was programmed to the memory cells of the first wordline. For example, in block 410, the wordlines storing pages 422-1 through 422-5 were programmed, while the wordlines storing pages 422-6 through 422-n were not programmed and remain in the erased state. In one embodiment, block handling component 113 tracks the last wordline that was programmed (e.g., the wordline storing page 422-5) and compares it to the last wordline in the block 410 (e.g., the wordline storing page 422-n). If the last wordline that was programmed does not equal the last wordline in the block, then block handling component 113 determines that the block 410 is a partial block. If the block is not a partial block (i.e., if the last wordline that was programmed is the last wordline in the block), then at operation 325, the processing logic continues to program other blocks in memory device 130.

If, however, the block is a partial block, at operation 330, the processing logic initiates a partial block handling protocol for the block 410. In one embodiment, as described in more detail blow, block handling component 113 performs a series of padding operations on the block to program the unprogrammed subset of the plurality of wordlines (e.g., the wordlines storing pages 422-6 through 422-n) with padding data having a mixed data pattern. That is at least one wordline is programmed with TLC padding data and at least one wordline is programmed with either SLC or MLC padding data.

At operation 335, the processing logic sends a first programming command to the memory device 130 to program one or more wordlines of the block 410 with first padding data having a first data pattern. In one embodiment, the one or more wordlines are adjacent to a last wordline of the block programmed before the block was closed (e.g., the wordline storing page 422-5). For example, the one or more wordlines could include the wordline storing page 422-6. In one embodiment, the first data pattern programmed to the wordline storing page 422-6 comprises a triple-level cell (TLC) data pattern having three bits of data per cell.

At operation 340, the processing logic sends a second programming command to the memory device 130 to program all of a set of remaining wordlines of the block 410 with second padding data having a second data pattern. In one embodiment, the set of remaining wordlines includes all of the rest of the wordlines in block 410 (e.g., the wordlines storing page 422-7 through 422-n). In embodiment, the second data pattern comprises fewer bits of data per cell than the first data pattern used at operation 335. For example, the second data pattern programmed to the wordlines storing page 422-7 through 422-n comprises at least one of a single-level cell (SLC) data pattern having one bit of data per cell or a multi-level cell (MLC) data pattern having two bits of data per cell.

Figure 5:
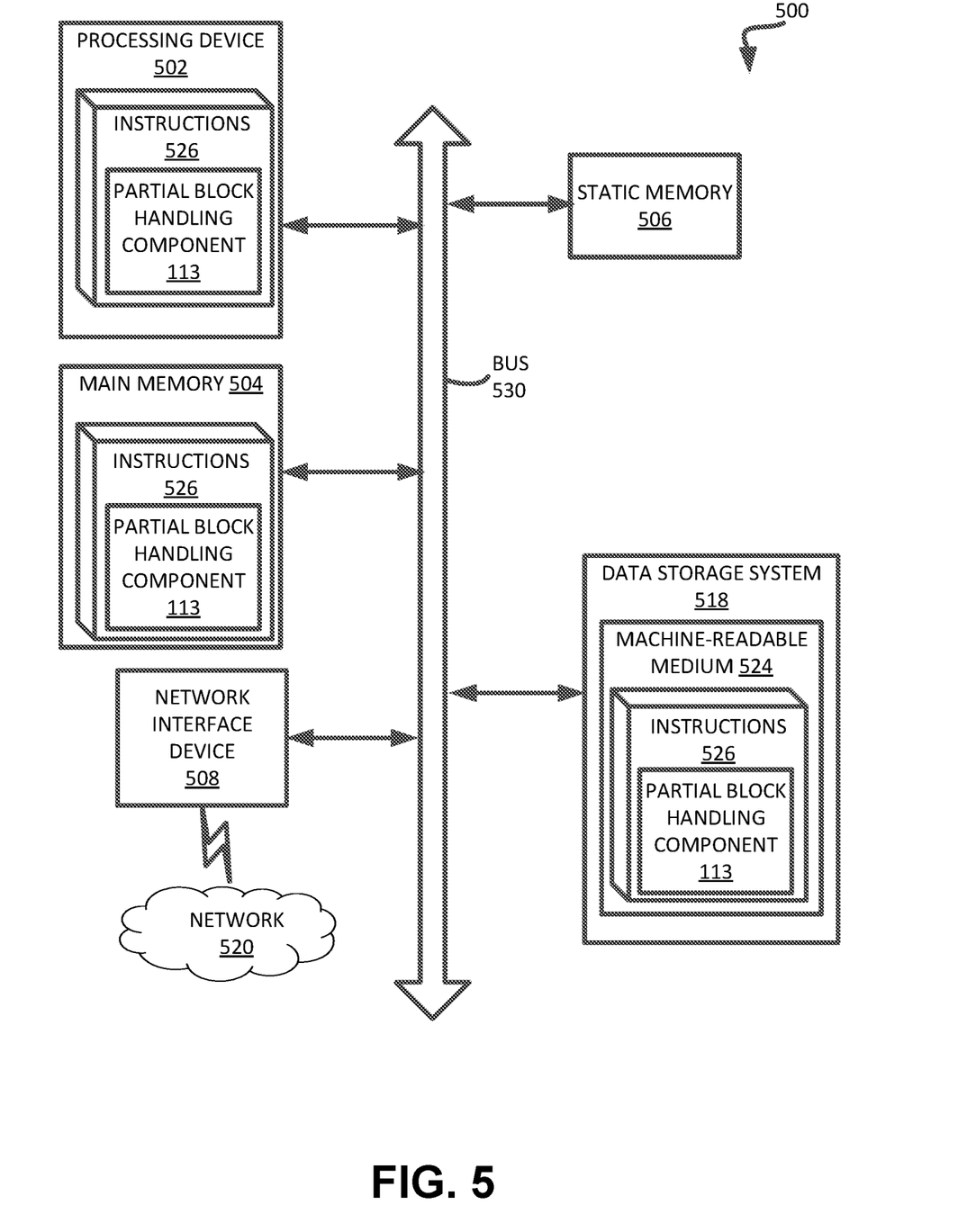
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the partial block handling component 113 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1A.

In one embodiment, the instructions 526 include instructions to implement functionality corresponding to the partial block handling component 113 of FIG. 1A). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
initiating a partial block handling protocol for a closed block of the memory device, the block comprising a plurality of wordlines;
sending a first programming command to the memory device to program one or more wordlines of the block with first padding data having a first data pattern, wherein the one or more wordlines are adjacent to a last wordline of the block programmed before the block was closed; and sending a second programming command to the memory device to program all of a set of remaining wordlines of the block with second padding data having a second data pattern comprising fewer bits of data per cell than the first data pattern.

2. The system of claim 1, wherein initiating the partial block handling protocol comprises:

determining that a predetermined period of time associated with programming the block of the memory device has expired, wherein a first subset of the plurality of wordlines are programmed during the predetermined period of time.

3. The system of claim 2, wherein initiating the partial block handling protocol further comprises:

responsive to determining that the predetermined period of time has expired, logically closing the block of the memory device to prevent additional program operations from being performed on the block; and determining that the block comprises a second subset of the plurality of wordlines not programmed during the predetermined period of time.

4. The system of claim 3, wherein the first subset of the plurality of wordlines comprises the last wordline of the block programmed before the block was closed, and wherein the second subset of the plurality of wordlines comprises (a) the one or more wordlines adjacent to the last wordline of the block programmed before the block was closed and (b) the set of remaining wordlines of the block.

5. The system of claim 1, wherein the first data pattern comprises a triple-level cell (TLC) data pattern having three bits of data per cell.

6. The system of claim 1, wherein the second data pattern comprises a single-level cell (SLC) data pattern having one bit of data per cell.

7. The system of claim 1, wherein the second data pattern comprises a multi-level cell (MLC) data pattern having two bits of data per cell.

8. A method comprising:

initiating a partial block handling protocol for a closed block of a memory device, the block comprising a plurality of wordlines;

sending a first programming command to the memory device to program one or more wordlines of the block with first padding data having a first data pattern, wherein the one or more wordlines are adjacent to a last wordline of the block programmed before the block was closed; and sending a second programming command to the memory device to program all of a set of remaining wordlines of the block with second padding data having a second data pattern comprising fewer bits of data per cell than the first data pattern.

9. The method of claim 8, wherein initiating the partial block handling protocol comprises:

determining that a predetermined period of time associated with programming the block of the memory device has expired, wherein a first subset of the plurality of wordlines are programmed during the predetermined period of time.

10. The method of claim 9, wherein initiating the partial block handling protocol further comprises:

responsive to determining that the predetermined period of time has expired, logically closing the block of the memory device to prevent additional program operations from being performed on the block; and determining that the block comprises a second subset of the plurality of wordlines not programmed during the predetermined period of time.

11. The method of claim 10, wherein the first subset of the plurality of wordlines comprises the last wordline of the block programmed before the block was closed, and wherein the second subset of the plurality of wordlines comprises (a) the one or more wordlines adjacent to the last wordline of the block programmed before the block was closed and (b) the set of remaining wordlines of the block.

12. The method of claim 8, wherein the first data pattern comprises a triple-level cell (TLC) data pattern having three bits of data per cell.

13. The method of claim 8, wherein the second data pattern comprises a single-level cell (SLC) data pattern having one bit of data per cell.

14. The method of claim 8, wherein the second data pattern comprises a multi-level cell (MLC) data pattern having two bits of data per cell.

15. A non-transitory computer-readable storage medium comprising instructions that, when executed by a processing device, cause the processing device to perform operations comprising:

performing a series of programming operations on a block of a memory device for a predetermined period of time, wherein memory cells associated with a first subset of a plurality of wordlines of the block are programmed during predetermined period of time;

upon expiration of the predetermined period of time, determining that a second subset of the plurality of wordlines of the block remain unprogrammed; and performing a series of padding operations on the block to program the second subset of the plurality of wordlines with padding data having a mixed data pattern.

16. The non-transitory computer-readable storage medium of claim 15, wherein the instructions cause the processing device to perform operations further comprising:

upon expiration of the predetermined period of time, logically closing the block of the memory device to prevent additional programming operations from being performed on the block.

17. The non-transitory computer-readable storage medium of claim 15, wherein performing the series of padding operations on the block comprises:

programming one or more wordlines of the second subset with first padding data having a first data pattern, wherein the one or more wordlines are adjacent to a last programmed wordline of the first subset.

18. The non-transitory computer-readable storage medium of claim 17, wherein performing the series of padding operations on the block comprises:

programming a set of remaining wordlines of the second subset with second padding data having a second data pattern comprising fewer bits of data per cell than the first data pattern.

19. The non-transitory computer-readable storage medium of claim 18, wherein the first data pattern comprises a triple-level cell (TLC) data pattern having three bits of data per cell.

20. The non-transitory computer-readable storage medium of claim 18, wherein the second data pattern comprises at least one of a single-level cell (SLC) data pattern having one bit of data per cell or a multi-level cell (MLC) data pattern having two bits of data per cell.

* * * * *